(12) United States Patent
De Boer

(10) Patent No.: US 6,579,752 B2
(45) Date of Patent: Jun. 17, 2003

(54) PHOSPHORUS DOPANT CONTROL IN LOW-TEMPERATURE SI AND SIGE EPITAXY

(75) Inventor: Wiebe Barteld De Boer, Hopewell Junction, NY (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/107,009

(22) Filed: Mar. 26, 2002

(65) Prior Publication Data

US 2003/0003646 A1 Jan. 2, 2003

(30) Foreign Application Priority Data

Mar. 30, 2001 (EP) .......................................... 01201235
Mar. 30, 2001 (EP) .......................................... 01201236
Oct. 12, 2001 (EP) .......................................... 01203904

(51) Int. Cl.$^7$ ................................................ H01L 21/8238
(52) U.S. Cl. ................. 438/222; 438/234; 438/235; 438/312; 438/313; 438/315; 438/341; 438/357; 257/461; 257/463; 257/464

(58) Field of Search .............................. 438/222, 234, 438/235, 312, 313, 315, 341, 357, 363, 364, 479, 220; 257/461, 463, 464

(56) References Cited

U.S. PATENT DOCUMENTS

| | | | | |
|---|---|---|---|---|
| 5,700,520 A | | 12/1997 | Beinglass et al. ......... 427/255.1 |
| 5,821,155 A | * | 10/1998 | Izumi et al. ................. 438/479 |
| 5,915,187 A | | 6/1999 | Huisman et al. ............. 438/379 |
| 6,197,666 B1 | | 3/2001 | Schafer et al. .............. 438/509 |
| 6,300,558 B1 | * | 10/2001 | Takamoto et al. ........... 136/262 |
| 6,346,452 B1 | * | 2/2002 | Kabir et al. ................. 438/312 |

* cited by examiner

Primary Examiner—Hoai Ho
Assistant Examiner—Reneé R. Berry
(74) Attorney, Agent, or Firm—Aaron Walker

(57) ABSTRACT

A method of manufacturing a semiconductor device comprising the step of epitaxially growing of an n-type doped layer of a semiconductor material using an n-type dopant gas, the growth process being performed at a pressure higher than $2.66 \times 10^4$ Pa.

8 Claims, 3 Drawing Sheets

PHOSPHORUS DOPANT CONTROL IN LOW-TEMPERATURE SI AND SIGE EPITAXY

The present invention relates to a method of manufacturing a semiconductor device comprising the step of epitaxially growing of an n-type doped layer of a semiconductor material using an n-type dopant gas.

Such a method relates to the growth of doped epitaxial Si or $Si_{1-x}Ge_x$ (SiGe) layers on monocrystalline silicon by chemical vapour deposition (CVD). Controlling the dopant concentration and dopant profile in such epitaxial layers may be a challenging task.

It is known in the art that during epitaxial growth of Si or SiGe in combination with doping at a low temperature, the incorporation of dopant continues after switching off the dopant supply. This process is generally known as the autodoping effect. Due to this effect in such an epitaxial growth process, the dopant profile obtained will differ from the desired profile.

Typically, such an autodoping effect occurs due to (high-temperature) diffusion of a dopant from the underlying layer into the grown epitaxial layer, due to desorption of dopant species from the walls and the substrate holder of an epitaxy reactor vessel, and due to evaporation of dopant species from the front and back side of the substrate. Autodoping may thus alter the dopant concentration in the epitaxial layer in a rather unpredictable manner.

However, it is also known in the art that at a low growth temperature, segregation of n-type dopants (P, As) occurs at the Si surface, which influences the dopant profile in the epitaxial layer.

Thus, high-temperature processes (at a temperature between ~800 and ~1200° C.) have been developed in which the autodoping effect is suppressed, while at the same time segregation of the dopant is avoided.

EP 0905288 A1 discloses a high temperature CVD process for growth of epitaxial layers in which the dopant concentration changes abruptly at the interface of the epitaxial layer and the monocrystalline Si substrate. During the final stage of the pre-epi bake, when most or all of the native oxide has been removed, a pressure pulse is generated by a flow of reducing gas which lowers the dopant concentration at the surface. The pressure is increased from ~1.33×10$^4$ Pa to ~1,013×10$^5$ Pa. After a subsequent purge step to reduce the pressure again to ~1.33×10$^4$ Pa, an epitaxial film is grown in a low-pressure CVD process, in which the autodoping effect is suppressed.

Methods according to the prior art, as described above, disadvantageously suffer from the fact that growth processes take place at a relatively high temperature. At a high temperature, the diffusion rate of dopants is high, which strongly complicates the formation of an abrupt dopant profile in the epitaxial layer, i.e., a well-defined (e.g. block-shaped) concentration profile of the n-type dopant.

Furthermore, a well-known way to prevent autodoping is the removal of excess P (or As) from the surface of a semiconductor wafer and from the inside surfaces of the epitaxy reactor chamber in a desorption step at a reduced pressure and a high temperature. However, such a high-temperature step defeats the purpose to grow steep profiles due to high diffusion rates of the dopants at that temperature.

Moreover, the methods from the prior art all relate to epitaxial layers having a thickness of at least one micron. The formation of shallow layers with abrupt n-type dopant profiles does not appear feasible if use is made of the methods from the prior art.

It is an object of the present invention to overcome the disadvantages of the prior art by providing a process which allows the formation of thin Si or SiGe epitaxial layers with well-defined and abrupt n-type dopant profiles.

The object of the present invention is obtained by a method of manufacturing a semiconductor device comprising the step of epitaxially growing of an n-type doped layer of a semiconductor material using an n-type dopant gas, the growth process being performed at a pressure higher than 2.66×10$^4$ Pa.

Advantageously, the method according to the present invention enables the autodoping of epitaxial layers to be suppressed by using an n-type dopant. Moreover, the growth of very thin epitaxial layers (less than ~100 nm) with an abrupt n-type dopant profile is feasible using the method according to the present invention.

Below, the invention will be explained with reference to some drawings, which are intended for illustration purposes only and not to limit the scope of protection as defined in the accompanying claims.

Hereinbelow, the growth method according to the present invention will be explained by means of some experiments which illustrate the growth of n-type doped epitaxial Si or SiGe layers. The dopant profiles resulting from these experiments are measured by SIMS. The analysis of the results will clearly show the improvement obtained by growing such doped epitaxial Si or SiGe layers by means of a method in accordance with the present invention.

The growth of a Si epitaxial layer on a Si substrate by means of CVD is performed by passing a Si-containing gas over a Si wafer in a conditioned environment. Usually, a H$_2$ carrier gas containing SiH$_4$, SiH$_2$Cl$_2$, SiHCl$_3$ or SiCl$_4$ as Si precursor is used. The growing layer can be doped in-situ by adding e.g., B$_2$H$_6$ for p-type layers and AsH$_3$ or PH$_3$ for n-type layers to the gas stream.

At low temperatures, below 800° C. and preferably around or below 700° C., the diffusion of dopant atoms is negligible and, in theory, extremely steep doping profiles (so-called box profiles) can be grown. Low-temperature epitaxy commonly takes place at reduced pressure (6.6× 10$^2$–6.6×10$^3$ Pa) to benefit from the lower partial pressure of contaminants like oxygen and moisture.

When p-type doped Si or SiGe layers (B) are grown, however, the profiles for n-type dopants are vastly inferior to the p-type layers, due to, among other things, the autodoping effect described above.

Figure 1:
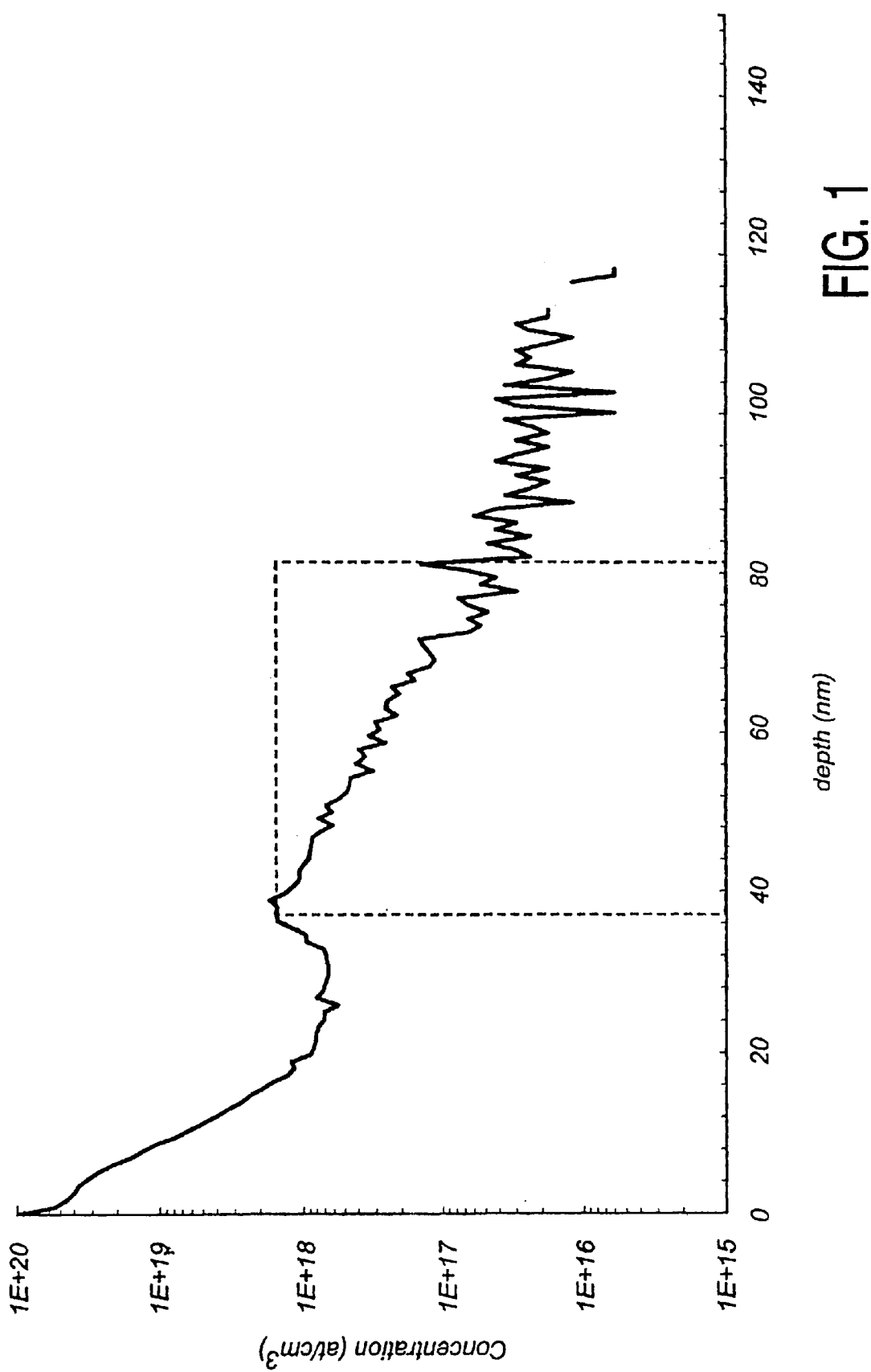
FIG. 1 shows a SIMS (Secondary Ion Mass Spectroscopy) plot of an As-doped epitaxial layer with an Si capping layer, produced by a growing method from the prior art.

FIG. 1 shows a SIMS plot of an As-doped epitaxial layer on a semiconductor surface, produced by means of a growing method from the prior art. The As-doped epitaxial layer was grown in a low-pressure CVD process at 700° C., 2.66×10$^3$ Pa with a gas flow of SiH$_4$ and an AsH$_3$ gas flow. As a carrier gas H$_2$ was used. The intention was to grow an undoped epitaxial Si capping layer on top of an As-doped epitaxial layer.

The SIMS plot shows the profile of arsenic (As) as a function of sputtering depth in the sample.

In FIG. 1, a SIMS plot is shown of an As-doped layer with a doped capping layer. The target profile having a Si capping layer without dopant is indicated by the dotted line in FIG. 1. In the actual profile neither the leading slope nor the trailing slope is steep. What is even worse is the fact that after the $AsH_3$ flow has been stopped there still is As delivery, resulting in a high As concentration at the surface. The Si capping layer is shown to be unintentionally doped.

It is noted that the high As surface concentration is not an artifact called "the SIMS artifact", well-known to persons skilled in the art, but indicates a real accumulation of As at the surface.

The profile in FIG. 1 is representative of what happens when As or P-doped layers are grown at relatively low temperature and low pressure. It is noted that usually P profiles are found to have a slightly better defined shape than As profiles.

The Si precursor that is used makes no significant difference to the resulting dopant concentration profile. A solution to improve the trailing slope basically consists in exposing the surface to the doping gas without a Si precursor. After a while the gas flow of the dopant gas is switched off and the flow of the Si precursor (e.g. $SiH_2Cl_2$ or $SiH_4$) is switched on. At this point the growth of the epitaxial layer starts.

Figure 2:
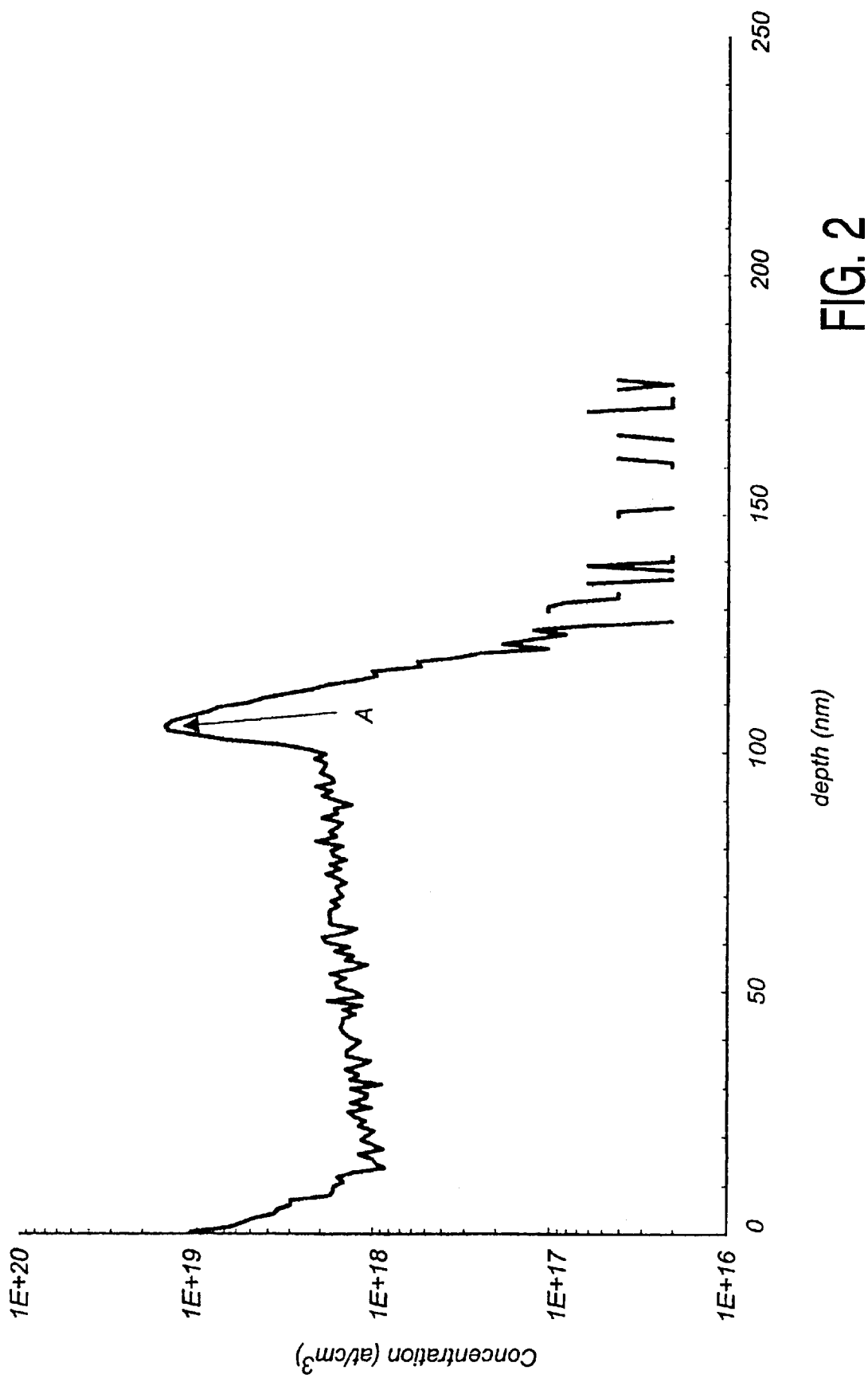
FIG. 2 shows a SIMS plot of a P-spike in an epitaxial layer grown by exposure of a monocrystalline Si surface to a phosphorus-containing gaseous species using a method from the prior art in which the dopant gas and the Si source gas are applied consecutively rather than simultaneously.

FIG. 2 shows an SIMS plot of a P-spike in an epitaxial layer grown by exposure of a monocrystalline Si surface to a phosphorus-containing gaseous species using a method from the prior art in which the dopant gas and the Si source gas are applied consecutively rather than simultaneously.

The SIMS plot shows the profile of phosphorus (P) as a function of sputtering depth in the sample. This dopant profile was grown using $SiH_4$ and $PH_3$ at 700° C. and a pressure of $2.7\times10^3$ Pa (carrier gas: $H_2$). Using this method, steep slopes can be obtained, as is clearly shown in FIG. 2. A P spike has been grown at a depth of ~110 nm.

After exposing the surface to a $PH_3$-containing gas ambient (in $H_2$), the $PH_3$ gas source was closed and the Si source was opened to grow an epitaxial layer. In the SIMS plot this point is indicated by arrow A. In the SIMS plot, the Si capping layer is found between the surface and a depth below ~110 nm (as indicated by arrow A). It is obvious that this method does not solve the main problem, which is the very slow drop of the high P level in the Si capping layer ($>10^{18}$ atoms/cm$^3$).

As mentioned above, excess P (or As) can be removed from the surface of the wafer and from the inside surfaces of the epitaxy reactor chamber in a desorption step at reduced pressure and high temperature. However, the high temperature defeats the purpose of growing steep profiles at temperatures at which diffusion does not play a significant role.

Figure 3:
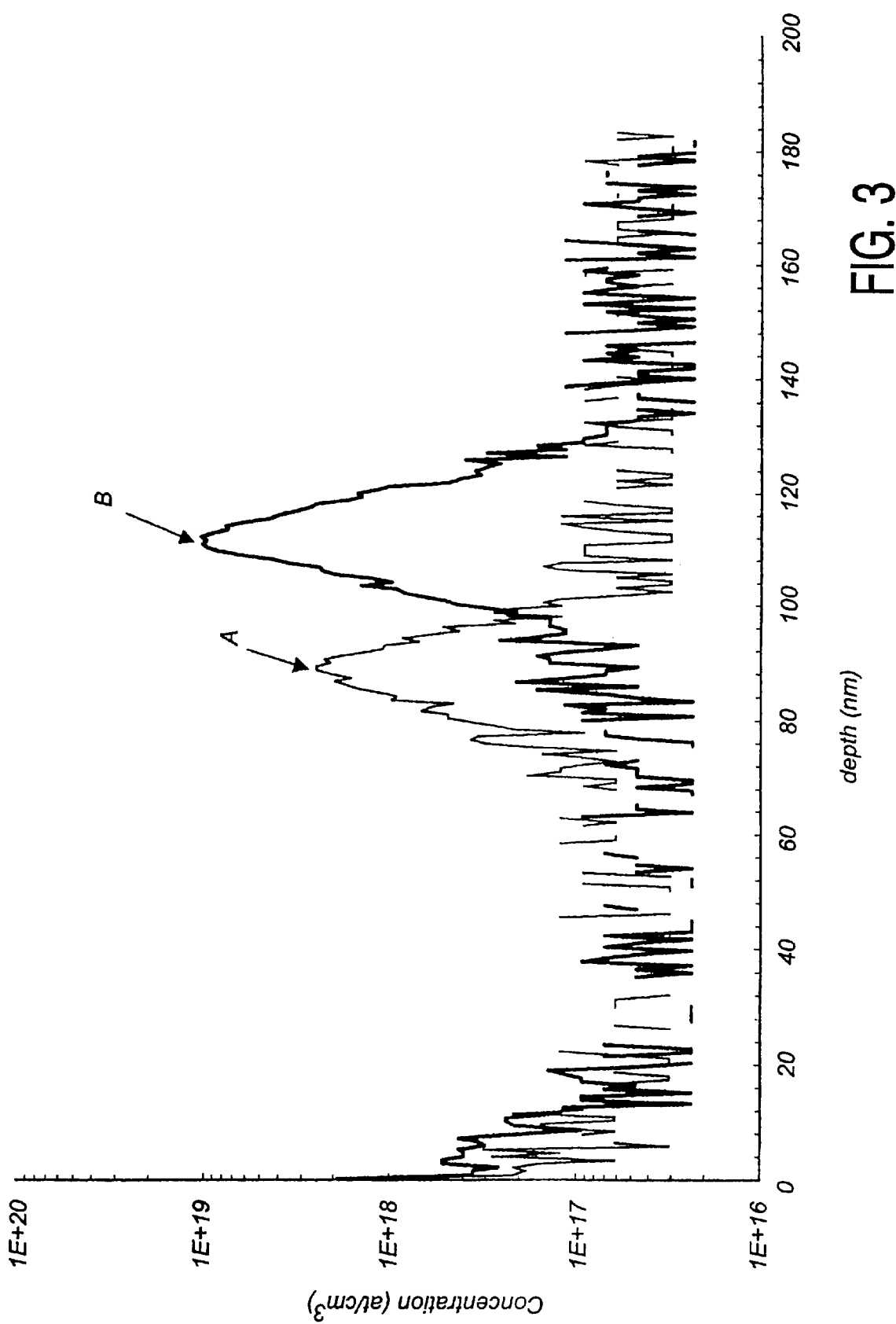
FIG. 3 shows a SIMS plot of examples of P-spikes in epitaxial layers grown by using the method of the present invention.

FIG. 3 shows a SIMS plot of examples of P-spikes grown by means of the method of the present invention.

The SIMS plot shows the profile of phosphorus (P) for each example as a function of sputtering depth in the respective sample.

In FIG. 3, by way of illustration, an example of a P-spike grown from a $SiH_2Cl_2$ precursor (indicated by arrow A), and an example of a P-spike grown for a $SiH_4$ precursor (arrow B) are shown. Each P-doped epitaxial layer was covered with a Si capping layer.

These P-spikes were grown using $SiH_2Cl_2$ and $SiH_4$, respectively, and $PH_3$ as the dopant at 700° C. and a pressure of ~$1.013\times10^5$ Pa (carrier gas: $H_2$). In each example, the Si capping layer was grown from the respective Si precursor gas in a subsequent step, after closing the $PH_3$ gas flow.

FIG. 3 shows that in both examples the leading slope of the P spike improves considerably when the growth takes place at atmospheric pressure rather than at reduced pressure. The Si capping layer appears to be free of dopant. The SIMS analysis shows that the dopant level is well below the detection limit.

It is noted that a similar result may be obtained at sub-atmospheric pressure substantially above ~$1.33\times10^4$ Pa. A preferred pressure turns out to be within the range of pressures above $2.66\times10^4$ Pa. A maximum pressure would be below $2.026\times10^5$ Pa.

Between the process where $SiH_2Cl_2$ is used as Si precursor and the process where $SiH_4$ is used as the precursor, no difference in dopant profile was found other than a different doping level and a different growth rate. The improvement over runs made at reduced pressure is clear (see FIG. 1). In FIG. 3, the P level at the surface side of the P-spike quickly drops to the SIMS detection limit. Using the method of the present invention, there is no sign of P segregation at the surface. In FIG. 3, the increase in concentration towards the surface is a SIMS artifact, well known to persons skilled in the art.

In general, it was found that P-doped layers can be properly controlled when the runs are made at atmospheric pressure rather than reduced pressure. Box-shaped structures can be grown with, sufficiently steep slopes, even when no special step in the CVD process is applied like e.g. exposing the surface to $PH_3$ without growing a layer. It is found that when $AsH_3$ is used as a doping gas the improvement is less spectacular.

In summary, the low temperature-growth of n-type doped layers can be controlled when $PH_3$ (or some other P-containing compound) is used as a precursor and when the growth is performed at atmospheric pressure, or rather at a pressure significantly higher than the pressure commonly used in low-temperature epitaxy.

What is claimed is:

1. A method of manufacturing a semiconductor device comprising the step of epitaxially growing of an n-type doped layer of a semiconductor material using an n-type dopant gas, the growth process being performed at a pressure higher than $2.66\times10^4$ Pa.

2. A method as claimed in claim 1, wherein a phosphorus-containing compound is applied as the n-type dopant gas.

3. A method as claimed in claim 2, wherein phosphine ($PH_3$) is applied as the phosphorus-containing compound.

4. A method as claimed in claim 1, wherein the growth process is performed at a pressure below $2.026\times10^5$ Pa.

5. A method as claimed in claim 1, wherein the growth process is performed at a pressure close to atmospheric pressure.

6. A method as claimed in claim 1, wherein the growth process is performed at a temperature below about 800° C.

7. A method as claimed in claim 6, wherein the growth process is performed at a temperature of about 700° C.

8. A method as claimed in claim 1, wherein silicon or a silicon-germanium alloy is applied as the semiconductor material.

* * * * *